(12) United States Patent
Jeng et al.

(10) Patent No.: US 7,151,042 B2
(45) Date of Patent: Dec. 19, 2006

(54) METHOD OF IMPROVING FLASH MEMORY PERFORMANCE

(75) Inventors: Pei-Ren Jeng, Hsinchu (TW); Hsuan-Ling Kao, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 51 days.

(21) Appl. No.: 11/049,230

(22) Filed: Feb. 2, 2005

(65) Prior Publication Data

US 2006/0172490 A1    Aug. 3, 2006

(51) Int. Cl.
*H01L 21/76* (2006.01)
(52) U.S. Cl. .................. 438/423; 438/257; 438/238; 438/381; 257/E21; 257/645; 257/694
(58) Field of Classification Search ................ 438/257, 438/238, 381, 423, 513, 263, 264, 267, 594, 438/663, 773, 954
See application file for complete search history.

(56) References Cited

U.S. PATENT DOCUMENTS 5,123,994 A * 6/1992 Paulsen et al. ............. 156/603
5,656,516 A * 8/1997 Suzuki ....................... 438/423
6,348,380 B1 * 2/2002 Weimer et al. ............. 438/257
6,624,023 B1 * 9/2003 Han et al. ................... 438/257

* cited by examiner

*Primary Examiner*—David Nhu
(74) *Attorney, Agent, or Firm*—Thomas, Kayden, Horstemeyer & Risley

(57) ABSTRACT

A method of improving flash memory performance. The method includes: providing a substrate having a gate structure thereon, the gate structure having a gate dielectric layer, a first polysilicon layer, an interploy dielectric layer, and a second polysilicon layer; then, depositing an gate insulating layer to enclose the gate structure, for forming side wall spacers; next, performing a first anneal on the substrate and the enclosed gate structure; then, performing a cell reoxidation on the substrate and the enclosed gate structure by dilute oxidation process using mixed gas comprising oxygen O2 and nitrogen N2. The invention reduces encroachment issues in the interpoly dielectric layer and the tunnel oxide and improves gate coupling ratio (GCR).

27 Claims, 5 Drawing Sheets

METHOD OF IMPROVING FLASH MEMORY PERFORMANCE

BACKGROUND OF THE INVENTION

1. Field of the Invention

The invention relates in general to a method of improving memory performance, and more particularly to a method of improving flash memory performance.

2. Description of the Related Art

The operation of EEPROM non-volatile memory devices, such as FLOTOX (floating gate tunnel oxide) flash memory developed by Intel, relies on the charge stored in a floating gate to induce changes in the threshold voltage. FIG. 1A illustrates cross sectional view of a relevant portion of an archetypal flash memory cell. The memory cell 100 consists of a substrate 110, a thin gate dielectric layer 120 (hereinafter "tunnel oxide") formed on the surface of the substrate 110, and a gate structure 130 overlying the tunnel oxide 120. A gate insulating layer 140 is deposited to enclose the gate structure 130, and then chemically etched to form sidewall spacers 140a and 140b as shown in FIG. 1B.

FIG. 2A illustrates the composition of the gate structure 130. The gate structure 130 includes a first polysilicon layer acting as a floating gate 136 overlying the tunnel oxide 120 and an interpoly dielectric layer 134 overlying the floating gate 136. The interpoly dielectric layer 134 is often a multi-layer insulator, such as an oxide-nitride-oxide (ONO) layer having two oxide layers 134-1 and 134-3 and a nitride layer 134-2. Additionally, a second polysilicon layer that acts as a control gate 132 overlies the interpoly dielectric layer 134 to complete the gate structure 130.

Since the charges are stored in the floating gate, the sidewall quality of gate structure dominates in the retention of flash memories. Usually a cell reoxidation process is performed after the gate structure formation to recover the damages induced by etching process. On the other hand, as the size of memory cells become smaller, it becomes advantageous to apply lower bias voltages on the control gate 132 for programming the memory cell 100. Lower voltages can be achieved by reducing the thickness of the interpoly dielectric layer 134, thereby increasing the control gate coupling ratio (GCR), which is defined as the voltage ratio of the control gate coupling to the floating gate. However, during the cell reoxidation of the gate structure 130, serious encroachment issues arising from conventional cell reoxidation process increases the thickness of the interpoly dielectric layer 134 so as to reduce GCR.

That is, in some conventional processes, the gate structure is first thermally treated by reoxidation before being deposited a gate insulating layer thereon to form sidewall spacers. However, such process is likely to suffer encroachment, in which oxygen is found diffusing into the tunnel oxide and the interpoly dielectric layer. Such encroachments significantly affect the performance of the memory cell. An approach to reduce encroachment issue is to utilize in-situ steam generation (ISSG) process, such as one disclosed in U.S. Pat. No. 6,624,023, assigned to the assignee of this invention. Another approach to overcome such problems is to deposit a gate insulating layer and perform reoxidation on the gate insulating layer enclosed gate structure 130 of FIG. 1A, such as by diffusion oxidation using a furnace, before the gate insulating layer is chemically etched to form sidewall spacers 140a and 140b. With the added gate insulating layer, the goal of such approach is to try slowing down the rate of reaction, thus decreasing encroachment.

However, as shown in FIG. 2B, the above mentioned methods are still found in the gate structure 130 to have considerable encroachment 138-1 and 138-2 occurring between the interface of interpoly dielectric layer 134 and polysilicon layer 132, and the interface of interpoly dielectric layer 134 and polysilicon layer 136. The introduced oxygen $O_2$ is also found encroaching into the tunnel oxide 120, as shown by 150(1) and 150(2) in the relevant portion of a memory cell 300 of FIG. 3. The $O_2$ encroachments 138-1 and 138-2 inevitably increase the thickness of the interpoly dielectric layer 134. Since a thicker interpoly dielectric layer equates to a smaller equivalent capacitance, and GCR is proportional to the capacitance of the ONO layer (interpoly dielectric layer), GCR inevitably decreases, which in turn reduces memory cell operation speed. The encroachment in the tunnel oxide 120 also decreases the drain coupling ratio (DCR) and the source coupling ratio (SCR), which also acts to reduce the memory cell operation. Hence, the required programming voltage applied on the control gate 132 needs to be undesirably increased in order to prevent slowing down of memory cell operation.

Accordingly, there is a need to provide a method of improving flash memory performance by reducing encroachment issues in the interpoly dielectric layer and the tunnel oxide.

SUMMARY OF THE INVENTION

It is therefore an object of the invention to provide a method of improving flash memory performance, for overcoming aforementioned problems due to encroachments.

The invention achieves the above-identified object by providing a method of improving flash memory performance. The method begins by providing a substrate. The substrate has a gate structure thereon, and the gate structure has a gate dielectric layer on the substrate, a first polysilicon layer on the gate dielectric layer, an interplay dielectric layer on the first polysilicon layer, and a second polysilicon layer on the interplay dielectric layer. Next, an gate insulating layer is deposited to enclose the gate structure, for forming side wall spacers. Next, a first anneal is performed on the substrate and the enclosed gate structure. Then, a cell reoxidation is performed on the substrate and the enclosed gate structure by dilute oxidation process using mixed gas comprising oxygen $O_2$ and nitrogen $N_2$, where the premixed gas with $O_2$ and $N_2$ has an oxygen proportion $O_2/(O_2+N_2)$ of greater than or equal to 30 percent and less than or equal to 70 percent.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
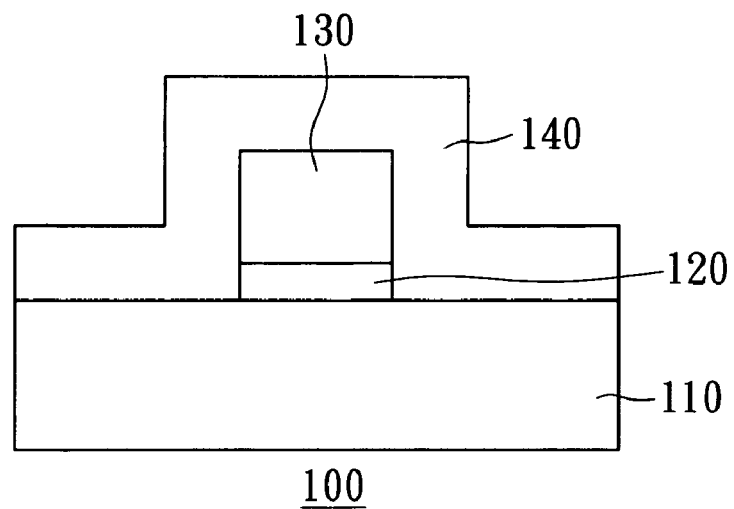
FIG. 1A (Prior Art) illustrates cross sectional view of a relevant portion of an archetypal flash memory cell.
Figure 1B:
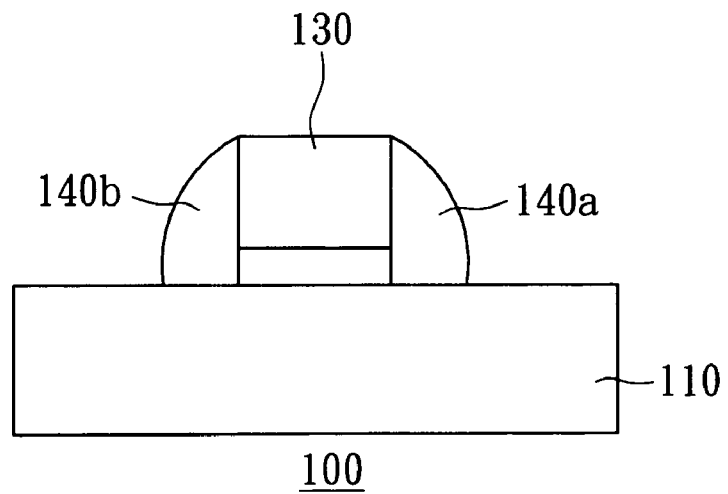
FIG. 1B (Prior Art) illustrates the morphology of the gate insulating layer after etching.
Figure 2A:
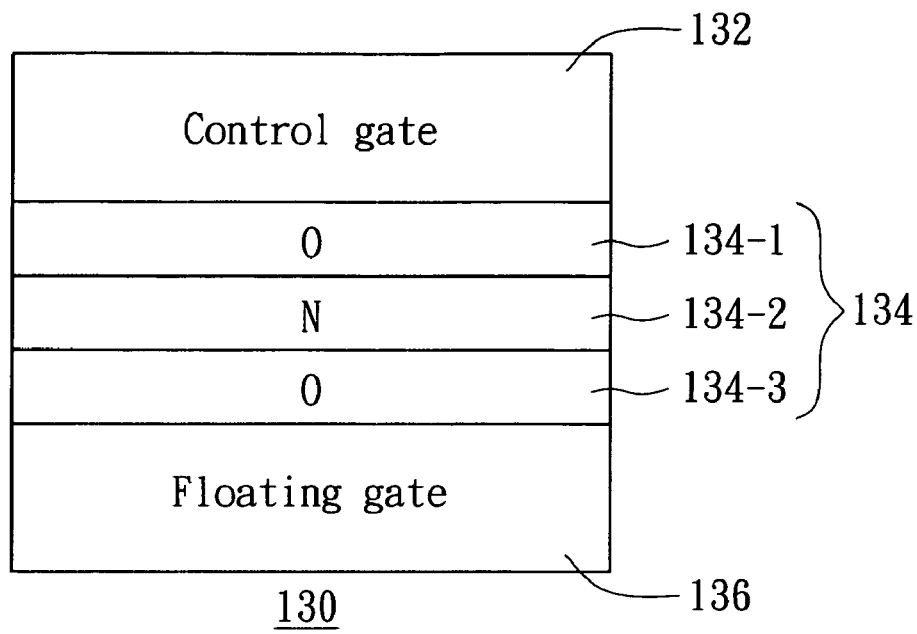
FIG. 2A (Prior Art) illustrates the composition of the gate structure 130.
Figure 2B:
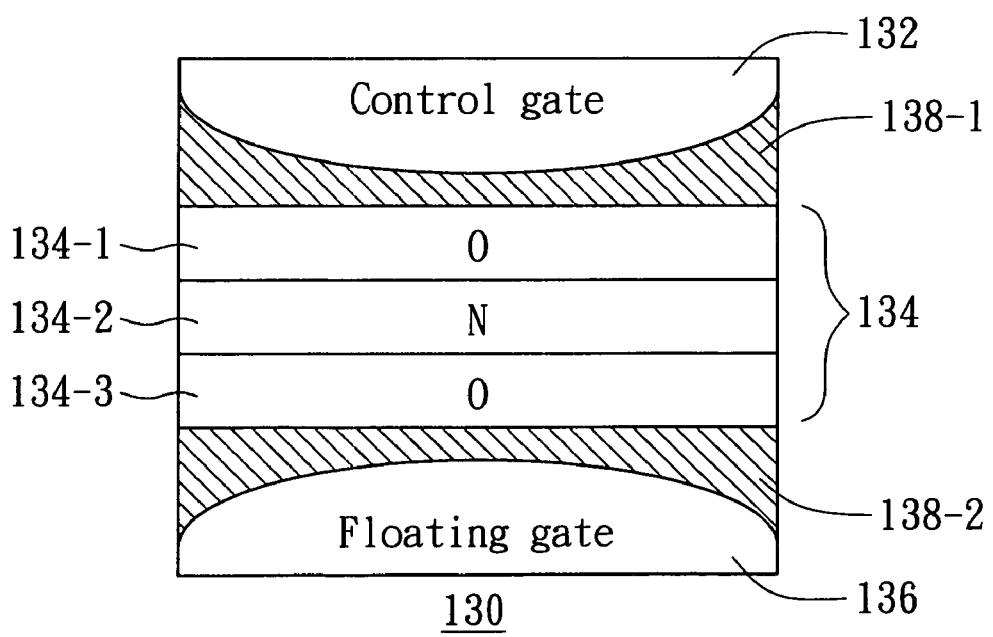
FIG. 2B (Prior Art) shows encroachment issues found between interfaces of the memory cell resulting from reoxidation.
Figure 3:
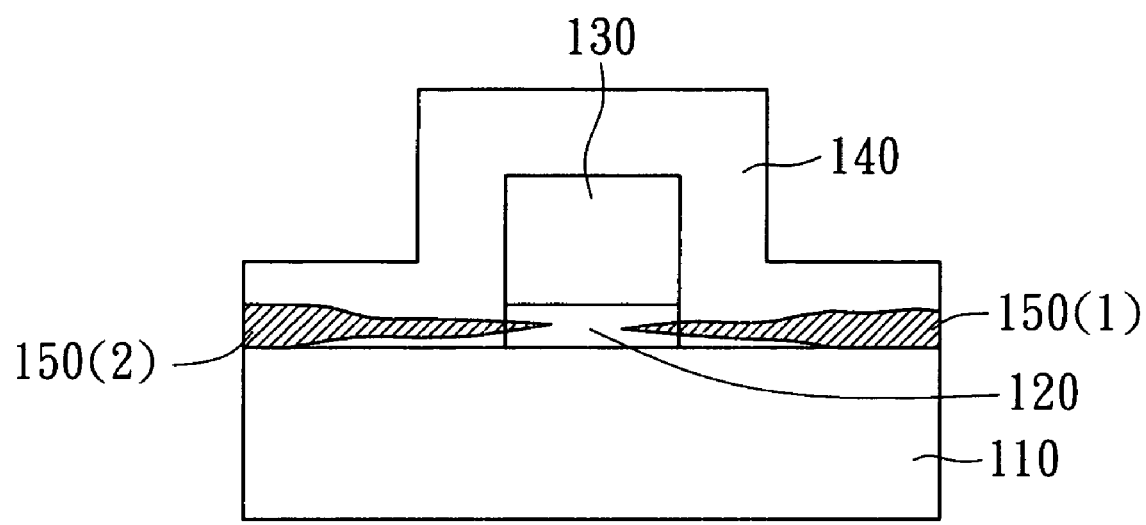
FIG. 3 (PRIOR ART) illustrates encroachment issues found in the tunnel oxide.
Figure 4:
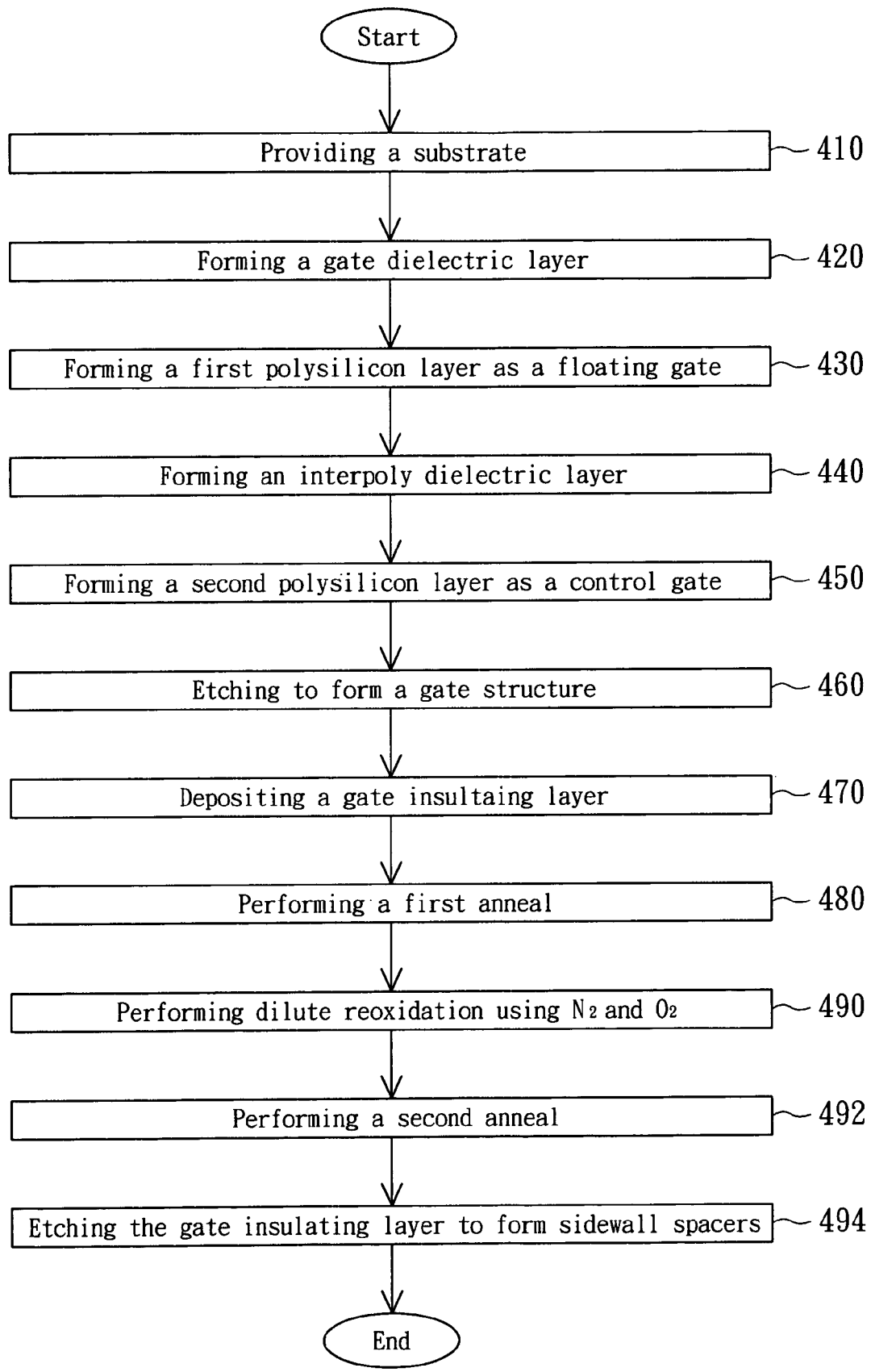
FIG. 4 is a flowchart showing a method of improving flash memory performance according to a preferred embodiment of the invention.

FIG. 4 shows a method of improving flash memory performance according to a preferred embodiment of the invention. The method begins at step 410, in which a substrate is provided. The substrate is for instance a p-type silicon substrate. Then, a gate dielectric layer is formed in step 420 on the subtrate. The gate dielectric layer is usually an oxide layer, preferably a silicon dioxide layer, and is commonly referred to as the "tunnel oxide". Then, a first polysilicon layer is formed on the gate dielectric layer to serve as a floating gate, as shown in step 430.

Next, in step 440, an interpoly dielectric layer is formed on the first polysilicon layer. The interpoly dielectric layer provides as an insulator, and is preferably a multi-layer ONO structure, including a top oxide layer, a silicon nitride layer, and a bottom oxide layer. Then, a second polysilicon layer is formed on the interpoly dielectric layer to serve as a control gate in step 450. Next, step 460 is performed to etch the second polysilicon layer, the interpoly dielectric layer, the first polysilicon layer and the gate dielectric layer to form a gate structure. Additionally, a hard mask can be deposited to overly the control gate to provide insulation.

Subsequently, a gate insulating layer is deposited to enclose the gate structure in step 470, for use in forming sidewall spacers. Materials used for the gate insulating layer can be silicon dioxide. The gate insulating layer can be deposited using a low-pressure chemical vapor deposition (LPCVD), an atmospheric pressure chemical vapor deposition (APCVD), or a sub-atmospheric chemical vapor deposition (SACVD). A first anneal is then performed on the gate structure, the gate insulating layer, and the substrate in step 480. The first anneal is preferably a nitrogen $N_2$ anneal. Following the first anneal, cell reoxidation is performed on the gate structure, the gate insulating layer and the substrate by dilute oxidation process using mixed gas comprising oxygen $O_2$ and nitrogen $N_2$, as indicated by step 490. Preferably, the pre-mixed gas with $O_2$ and $N_2$ has an oxygen proportion $O_2/(O_2+N_2)$ of greater than or equal to 30 percent and less than or equal to 70 percent. Upon completing the cell reoxidation, a second anneal is performed in step 492. The second anneal is preferably a nitrogen $N_2$ anneal. Then, step 494 is performed to etch the gate insulating layer to form the sidewall spacers. In the embodiment of the invention as illustrated, the first anneal, the cell reoxidation, and the second anneal are carried out in a sequence of steps under the same chemical process. However, the first anneal, the reoxidation, and the second anneal can also be carried out separately under three substantially independent processes.

Figure 5:
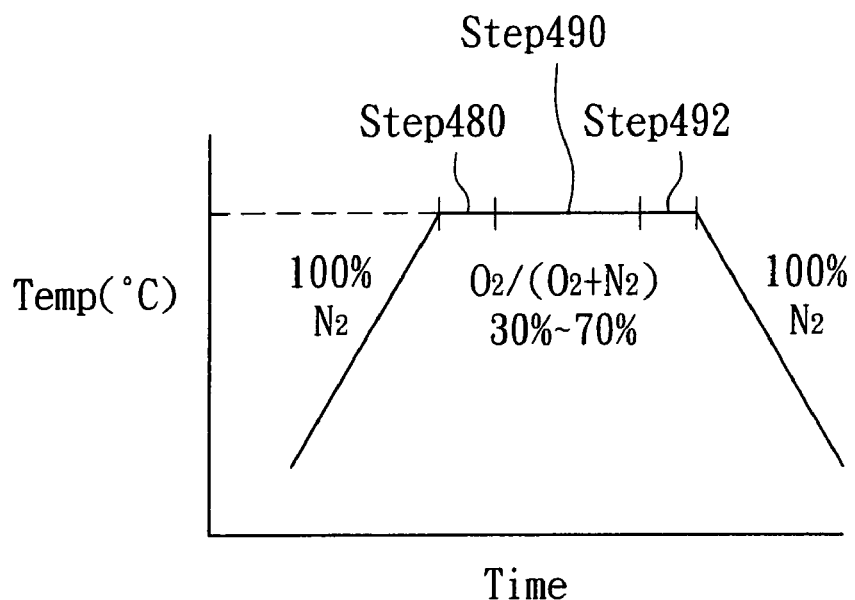
FIG. 5 shows a plot of a furnace recipe including the cell reoxidation and first and second anneal steps according to the preferred embodiment of the invention.

FIG. 5 shows a plot of a furnace recipe including the cell reoxidation and first and second anneal steps according to the preferred embodiment of the invention. The horizontal axis represents the time taken for performing corresponding steps indicated on the figure. The vertical axis represents the temperature profile. In this preferred embodiment, the temperature in the furnace is slowly raised to desired temperature in the presence of 100% nitrogen $N_2$. The first $N_2$ anneal, in step 480, is subsequently performed on the gate structure, the gate insulating layer and the substrate until the gate insulating layer is densified. Then, entering step 490 of cell reoxidation, oxygen is introduced into the furnace such that the ratio of nitrogen to oxygen is, for instance, 1:1. Then, upon completing the cell reoxidation, the gas in the furnace is brought back to 100% nitrogen $N_2$ atmosphere to perform the second anneal in step 492, for annealing the growth of the gate insulating layer. The method of improving flash memory performance according to the embodiment of the invention include at least one anneal step. That is, while the method of the invention preferably involves two anneal steps, considerable ONO encroachment reduction can also be achieved with only one anneal step.

Figure 6:
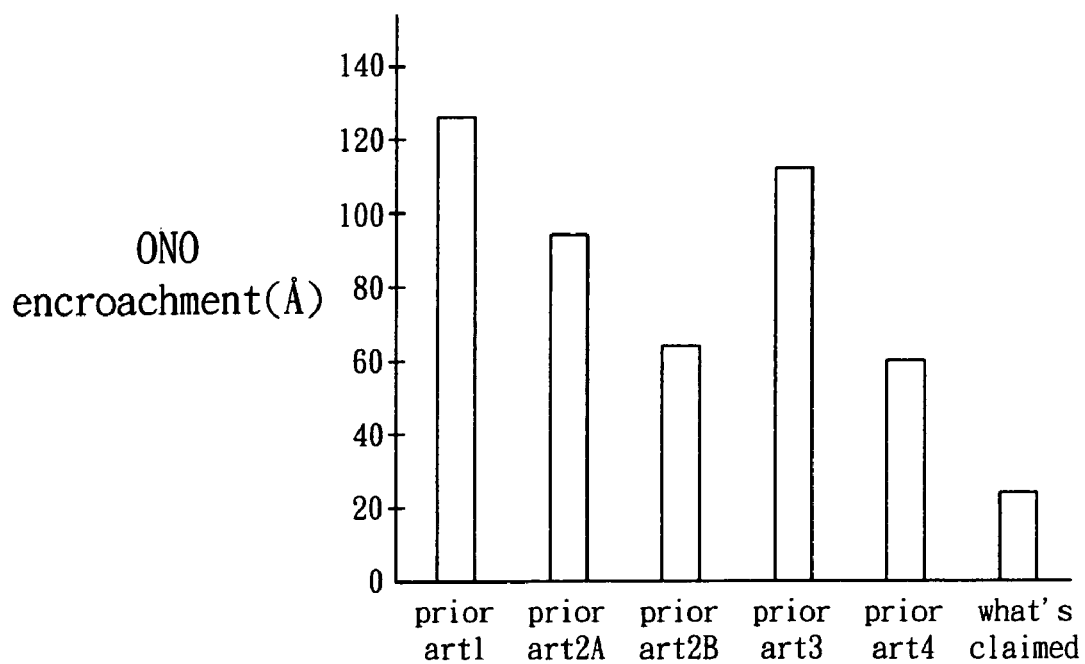
FIG. 6 shows a plot illustrating the effects achieved by the method according to the preferred embodiment of the invention.

The cell reoxidation by dilute oxidation process according to the preferred embodiment of the invention provides "gentler" oxidation in the sense that considerable encroachment issues are reduced. Referring to FIG. 6, a plot is shown illustrating the effects achieved by the preferred embodiment of the invention utilizing the proposed method. The vertical axis indicates the ONO encroachment experienced under respective methods, and is measured in angstroms. Prior Art1 is a method in which direct furnace reoxidation is performed before depositing the gate insulating layer. Prior art 2A and 2B both show ISSG reoxidation processes under different conditions, i.e. different hydrogen to oxygen concentration ratios. Prior Art 3 is a furnace reoxidation under 100% oxygen with spacer thickness in a range of 1500–2500 angstroms. Prior Art 4 is a similar approach as Prior Art 3 with thinner spacers of thickness in a range of 100–700 angstroms. Evidently, by utilizing the dilute oxidation process using mixed gas of oxygen O2 and nitrogen N2, combined with the first and the second anneal, according to the preferred embodiment of the invention, the encroachments are controlled under 30 angstroms, a considerable reduction from prior arts 1, 2A, 2B, 3A, and 3B.

By applying the preferred embodiment of the invention, the encroachment issues, which lead to ONO thickening and tunnel oxide thickening, that are associated with common reoxidation process are greatly reduced. Thus, the GCR can be controlled, and the memory cell performance can therefore be effectively increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of improving flash memory performance, comprising:

providing a substrate having a gate structure thereon, wherein the gate structure has a gate dielectric layer on the substrate, a floating gate on the gate dielectric layer, an interploy dielectric layer on the floating gate, a control gate on the interploy dielectric layer;

depositing a gate insulating layer to enclose the gate structure, for forming side wall spacers;

performing a first anneal on the substrate and the enclosed gate structure until the gate insulating layer is densified; and performing a cell reoxidation on the substrate and the enclosed gate structure by dilute oxidation process using mixed gas comprising essentially of oxygen $O_2$ and nitrogen $N_2$.

2. The method according to claim 1 further comprising performing a second anneal on the substrate and the enclosed gate structure.

3. The method according to claim 1 further comprising etching the gate insulating layer to form the side wall spacers.

4. The method according to claim 1, wherein the pre-mixed gas with $O_2$ and $N_2$ has an oxygen proportion $O_2/(O_2+N_2)$ of greater than or equal to 30 percent and less than or equal to 70 percent.

5. The method according to claim 1, wherein the first anneal is a nitrogen anneal.

6. The method according to claim 1, wherein the second anneal is a nitrogen anneal.

7. The method according to claim 1, wherein the gate dielectric layer comprises silicon dioxide.

8. The method according to claim 1, wherein the floating gate comprises polysilicon.

9. The method according to claim 1, wherein the control gate comprises polysilicon.

10. The method according to claim 1, wherein the interpoly dielectric layer comprises a top oxide layer, a silicon nitride layer, and a bottom oxide layer (oxide-nitride-oxide, ONO).

11. The method according to claim 1, wherein the step of providing a substrate comprises forming a mask on the control gate.

12. The method according to claim 1, wherein the gate insulating layer is deposited by using a lower pressure chemical vapor deposition (LPCVD) process.

13. The method according to claim 1, wherein the gate insulating layer is deposited by using an atmospheric pressure chemical vapor deposition (APCVD) process.

14. The method according to claim 1, wherein the gate insulating layer is deposited by a sub-atmospheric chemical vapor deposition (SACVD) process.

15. A method of improving flash memory performance, comprising:
   providing a substrate;
   forming a gate dielectric layer on the substrate;
   forming a first polysilicon layer on the gate dielectric layer;
   forming an interpoly dielectric layer on the first polysilicon layer;
   forming a second polysilicon layer on the interpoly dielectric layer;
   etching the second polysilicon layer, the interpoly dielectric layer, the first polysilicon layer and the gate dielectric layer to form a gate structure;
   depositing a gate insulating layer to enclose the gate structure, for forming sidewall spacers;
   performing a first anneal on the gate structure, the gate insulating layer and the substrate until the gate insulating layer is densified;
   performing a cell reoxidation on the gate structure, the gate insulating layer and the substrate by dilute oxidation process using mixed gas comprising oxygen $O_2$ and nitrogen $N_2$.

16. The method according to claim 15 further comprising performing a second anneal on the substrate and the enclosed gate structure.

17. The method according to claim 16, wherein the first anneal and the second anneal are each a nitrogen anneal.

18. The method according to claim 15 further comprising etching the gate insulating layer to form the side wall spacers.

19. The method according to claim 15, wherein the pre-mixed gas with $O_2$ and $N_2$ has an oxygen proportion $O_2/(O_2+N_2)$ of greater than or equal to 30 percent and less than or equal to 70 percent.

20. The method according to claim 15, wherein the gate dielectric layer comprises silicon dioxide.

21. The method according to claim 15, wherein the first polysilicon layer serves as a floating gate.

22. The method according to claim 15, wherein the second polysilicon layer serves as a control gate.

23. The method according to claim 15, wherein the interpoly dielectric layer comprises a top oxide layer, a silicon nitride layer, and a bottom oxide layer (oxide-nitride-oxide, ONO).

24. The method according to claim 15, wherein the step of providing a substrate having a gate structure thereon comprises depositing a mask on the second polysilicon layer.

25. The method according to claim 15, wherein the step of depositing a gate insulating layer is performed by a lower pressure chemical vapor deposition (LPCVD).

26. The method according to claim 15, wherein the step of depositing a gate insulating layer is performed by an atmospheric pressure chemical vapor deposition (APCVD).

27. The method according to claim 15, wherein the step of depositing a gate insulating layer is performed by a sub-atmospheric chemical vapor deposition (SACVD).

* * * * *